United States Patent [19]

Perretta

[11] Patent Number: 4,525,770
[45] Date of Patent: Jun. 25, 1985

[54] CLAMPING CIRCUIT BOARD GUIDES

[75] Inventor: Frederick A. Perretta, Trumbull, Conn.

[73] Assignee: United Technologies Corporation, Hartford, Conn.

[21] Appl. No.: 595,809

[22] Filed: Apr. 2, 1984

[51] Int. Cl.³ ............................................. H05K 7/20
[52] U.S. Cl. .................................. 361/399; 361/386; 361/415; 361/427; 211/41
[58] Field of Search ................. 361/382, 383, 386–389, 361/395, 399, 415, 385, 397, 417, 419, 427; 387, 388; 165/80 B, 80 D, 104.33; 211/41; 174/15 R, 174/16 HS; 339/17 L, 17 LC, 17 N

[56] References Cited

U.S. PATENT DOCUMENTS

| | | | |
|---|---|---|---|
| 4,120,021 | 10/1978 | Roush | 361/385 |
| 4,298,904 | 11/1981 | Koenig | 361/386 |
| 4,318,157 | 3/1982 | Rank | 361/386 |
| 4,459,639 | 7/1984 | Heil | 361/386 |

*Primary Examiner*—G. P. Tolin
*Attorney, Agent, or Firm*—Gerald E. Linden

[57] ABSTRACT

Circuit boards are retained within a chassis by guides, each having a fixed member and a corresponding floating member that can be clamped tightly against an edge of a board which has been inserted therebetween.

5 Claims, 2 Drawing Figures

CLAMPING CIRCUIT BOARD GUIDES

DESCRIPTION

1. Technical Field

This invention relates to holding circuit boards in position.

2. Background of the Invention

It is known to use slotted guides to support circuit boards in a chassis. To prevent movement of a board which could cause disengagement from an associated connecter, it is known to use hardware such as a necked pin on the board and a sliding clevis on the chassis to clamp the board in place. Component-free space must be provided on the board to accommodate the necked pin. It is also known to use thermal grease to enhance heat transfer from the board, through the guide, to the chassis.

DISCLOSURE OF THE INVENTION

Therefore, it is an object of this invention to support and clamp in place a circuit board without board-mounted hardware, while providing for heat transfer without requiring thermal grease.

According to the invention two opposite edges of a circuit board are each clamped between two adjacent L-shaped rails. One of the rails is fixed (to a chassis) and the other floats (moves) so that clamping force can be applied normal to the board. In a disclosed embodiment, longitudinal force is applied to the movable rail and is translated into the clamping force by cooperating pins in the chassis and oblique slots in the rail. In another disclosed embodiment, transverse force is applied to the movable rail and is translated into the clamping force by cooperating wedges in the elbow of the movable rail and beveled nuts which are drawn transversely against the wedges. The alternate embodiments provide for accessing the clamping feature of the guide via different parts of the chassis.

Additional objects, features and advantages of the invention will become apparent in light of the following description and accompanying drawings.

BEST MODE FOR CARRYING OUT THE INVENTION

Figure 1:
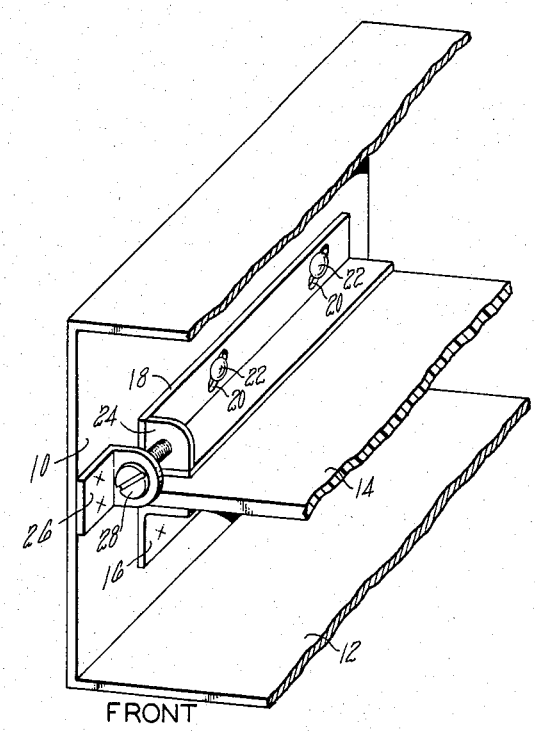
FIG. 1 is a partial cutaway view of a chassis showing the board guide of this invention in use.

As shown in FIG. 1, the clamping circuit board guide of this invention is disposed longitudinally along a side 10 of a chassis 12 and is essentially a channel which receives an edge of a circuit board 14 that is inserted into the chassis 12 through the front thereof. The channel is formed by the space between two elongated L-shaped rails 16 and 18 which are oriented so that each has a face in contact with the side 10 of the chassis 12.

The rail 16 is fixedly mounted to the chassis 12 in any suitable manner. The rail 18 is movably mounted to the chassis 12 so that the space between the fixed rail 16 and the movable rail 18 can be varied. In order to effect the variation in spacing, the rail 18 has two oblique slots 20, 20 disposed along its length on the side in contact with the chassis 12. Pins 22, 22 are fixed to the chassis and extend through the slots 20, 20, terminating in a region of increased diameter so that the rail 18 is loosely held (floats) against the side 10 of the chassis 12. The slots 20, 20 are oriented so that longitudinal movement of the floating rail 18 in the direction of the front of the chassis 12 will cause the floating rail 18 to move normal to the board 14 in the direction of the fixed rail 16. The particular oblique angle is not critical—an angle of forty-five degrees to normal is well suited to the operation of this invention.

Longitudinal motion is imparted to the floating rail 18 in the following manner. The floating rail 18 is provided with a threaded endplate 24 on the end toward the front of the chassis 12. A bracket 26 is mounted, in any suitable manner, to the chassis 12 to hold a screw 28 longitudinally, in register with the threads of the endplate 24 so that turning the screw 28 causes longitudinal motion of the floating rail 18. As the floating rail 18 closes on the edge of the circuit board 14, further movement is resisted by the fixed rail 16 and subsequent torque (longitudinal force) on the screw 28 translates into clamping force on the board 14. Thus the board 14 is securely clamped between the fixed rail 16 and the floating rail 18.

Typically, another clamping board guide is provided on the opposite side of the chassis 12 to hold the opposite edge of the board 14 and, although not shown, is essentially the mirror image of what is shown in FIG. 1.

Figure 2:
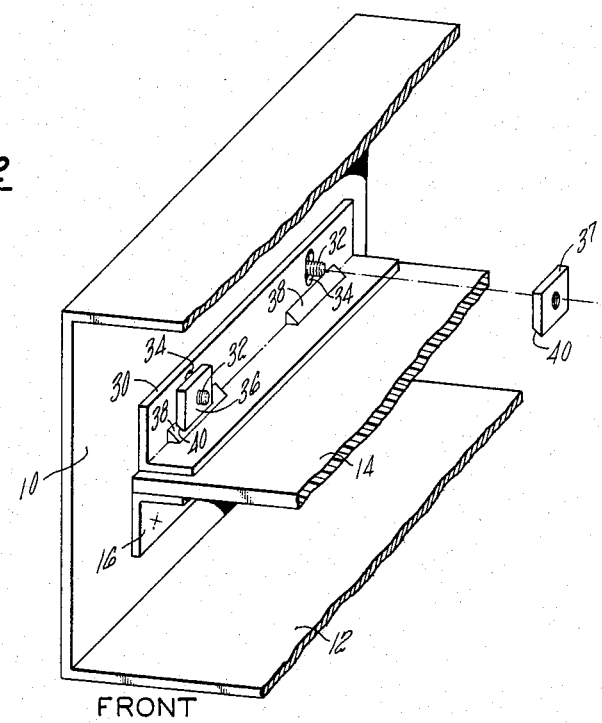
FIG. 2 is a partial cutaway view of the chassis showing an alternate embodiment of the board guide of this invention.

In an alternate embodiment of the invention, as shown in FIG. 2 an L-shaped floating rail 30 cooperates with the fixed rail 16 to clamp the board 14 therebetween. The floating rail 30 is loosely held in contact with the side 12 of the chassis 10 in the following manner. Two screws 32, 32 extend through the side 10 of the chassis 12, through two vertical slots 34, 34 in the side of the floating rail 30 which is in contact with the chassis 12, and thread into two nuts 36 and 37. The nut 37 is shown removed so that the slot 34 and the screw 32 can be viewed better.

The floating rail 30 has two wedge-shaped portions 38, 38 each located in the elbow of the "L" adjacent a slot 34. Each nut 36 and 37 has a flat chamfered edge 40 disposed to cooperate with a corresponding wedge 38 in the elbow of the rail 30 so that tightening the screw causes the nut 36 or 37 to move transversely toward the side 10 of the chassis 12, thereby causing movement of the floating rail 30 normal to the board 14 and in the direction of the fixed rail 16. When resistance to further motion is offered by the fixed member 16, subsequent torque (transverse force) on the screw 36 translates into clamping force on the board 14.

A feature of the invention is that the various embodiments provide for access to the screws which effect clamping from either the front (FIG. 1) or side (FIG. 2) of the chassis 12. The rails 16, 18 and 30 are made of aluminum which is very rigid and provides a thermal path between the board 14 and the chassis 12. Furthermore, the screws 28 and 32 may be captive screws.

Although the invention has been shown and described with respect to various embodiments, it should be understood that various changes could be made therein and thereto without departing from the spirit and scope of the invention.

What is claimed is:

1. A circuit board guide receiving a circuit board through the front of a chassis and extending along a side thereof, characterized by:

an L-shaped rail fixedly attached longitudinally along the side of the chassis;

an L-shaped rail movably attached longitudinally along the side of the chassis adjacent to the fixed rail with a space therebetween for receiving an edge of the circuit board; and clamping means for applying clamping force to the movable rail normal to the circuit board and in the direction of the fixed rail, thereby clamping the circuit board between the fixed and movable rails.

2. A circuit board guide according to claim 1 wherein the clamping means is characterized by:

at least one slot in the side of the movable rail in contact with the side of the chassis;

at least one pin attached to the side of the chassis and extending through the slot to movably attach the movable rail to the side of the chassis; and means for applying longitudinal force to the movable rail wherein said at least one slot is oriented obliquely so that said longitudinal force is translated into the clamping force.

3. A circuit board guide according to claim 1 wherein the clamping means is characterized by:

a wedge in the elbow of the movable rail;

a nut having a chamfered edge in contact with the wedge; and means for applying transverse force to the nut in the direction of the wedge so that the transverse force is translated into the clamping force.

4. A circuit board guide receiving a circuit board through the front of a chassis and extending along a side thereof, characterized by:

an L-shaped rail fixedly attached longitudinally along the side of the chassis;

an L-shaped rail movably attached longitudinally along the side of the chassis adjacent to the fixed rail with a space therebetween for receiving an edge of the circuit board;

at least one oblique slot in the side of the movable rail in contact with the side of the chassis;

at least one pin attached to the side of the chassis and extending just through the at least one oblique slot and having a head slightly larger than the slot to movably attach the movable rail to the side of the chassis;

a threaded end-plate on the movable rail; and a chassis-mounted screw engaging said end-plate for applying longitudinal force to the movable rail, wherein interaction of the at least one pin and the at least one slot causes the applied longitudinal force to be translated into a normal force for clamping the board between the rails.

5. A circuit board guide receiving a circuit board through the front of a chassis and extending along a side thereof, characterized by:

an L-shaped rail fixedly attached longitudinally along the side of the chassis;

an L-shaped rail movably attached longitudinally along the side of the chassis adjacent to the fixed rail with a space therebetween for receiving an edge of the circuit board;

a wedge in the elbow of the movable rail;

a nut having a chamfered edge in contact with the wedge;

a vertical slot in the side of the movable rail in contact with the side of the chassis; and a chassis-mounted screw extending through the slot and engaging said nut for applying a transverse force to the movable rail, wherein interaction of the nut and the wedge causes the transverse force to be translated into a normal force for clamping the board between the rails.

* * * * *

UNITED STATES PATENT AND TRADEMARK OFFICE
CERTIFICATE OF CORRECTION

PATENT NO. : 4,525,770

DATED : June 25, 1985

INVENTOR(S) : Frederick A. Perretta

It is certified that error appears in the above-identified patent and that said Letters Patent is hereby corrected as shown below:

Column 2, line 44    After "screw" insert --32--

Signed and Sealed this

Twenty-fourth Day of December 1985

[SEAL]

Attest:

DONALD J. QUIGG

Attesting Officer

Commissioner of Patents and Trademarks